(12) United States Patent
Vajo et al.

(10) Patent No.: US 10,336,017 B2
(45) Date of Patent: Jul. 2, 2019

(54) MICROWIRE ARRAY DEVICES AND METHODS FOR FABRICATING POLYMERIC SHEETS CONTAINING MICROWIRES

(71) Applicant: The Boeing Company, Chicago, IL (US)

(72) Inventors: John J. Vajo, West Hills, CA (US); Shanying Cui, Calabasas, CA (US); Adam F. Gross, Santa Monica, CA (US)

(73) Assignee: Boeing Company, the, Chicago, IL (US)

( * ) Notice: Subject to any disclaimer, the term of this patent is extended or adjusted under 35 U.S.C. 154(b) by 0 days.

(21) Appl. No.: 15/199,309

(22) Filed: Jun. 30, 2016

(65) Prior Publication Data

US 2018/0007819 A1 Jan. 4, 2018

(51) Int. Cl.
| | |
|---|---|
| *B29C 70/62* | (2006.01) |
| *B29C 70/82* | (2006.01) |
| *B29C 70/88* | (2006.01) |
| *B29C 70/72* | (2006.01) |
| *B29C 70/68* | (2006.01) |
| *H05K 9/00* | (2006.01) |
| *H01F 1/00* | (2006.01) |

(52) U.S. Cl.
CPC ............ *B29C 70/62* (2013.01); *B29C 70/682* (2013.01); *B29C 70/72* (2013.01); *B29C 70/82* (2013.01); *B29C 70/882* (2013.01); *H01F 1/0072* (2013.01); *H05K 9/009* (2013.01); *H05K 9/0081* (2013.01); *B29K 2995/0044* (2013.01)

(58) Field of Classification Search
CPC ....... B29C 70/682; B29C 70/72; B29C 70/82; B29C 70/882
See application file for complete search history.

(56) References Cited

U.S. PATENT DOCUMENTS

| | | |
|---|---|---|
| 6,741,019 B1 | 5/2004 | Filas et al. |
| 2014/0201980 A1 | 7/2014 | Beardslee et al. |

OTHER PUBLICATIONS

Srivastava et al, Growth and characterization of $\alpha$-$Fe_2O_3$ nanowires, AIP Publishing, (http://dx.doi.org/10.1063/1.2776222), Sep. 7, 2007.

(Continued)

*Primary Examiner* — Benjamin A Schiffman
(74) *Attorney, Agent, or Firm* — Parsons Behle & Latimer (57) ABSTRACT

A method for fabricating polymeric sheets containing microwires includes encapsulating at least a portion of individual lengths of a plurality of microwires in a non-conductive polymeric sheet while the microwires are attached to the substrate. The microwires are then detached from the substrate without removing the microwires from the polymeric sheet. The detaching step forms a separated polymeric sheet containing the detached microwires. Individual detached microwires of the plurality are approximately perpendicular to the separated polymeric sheet. A microwire array device includes a non-conductive polymeric sheet and a plurality of microwires. Individual microwires of the plurality have an independent length at least partially encapsulated by the polymeric sheet, are approximately perpendicular to the polymeric sheet, and contain magnetic ferrite.

20 Claims, 4 Drawing Sheets

(56) References Cited

OTHER PUBLICATIONS

Yuan et al, The origin of hematite nanowire growth during the thermal oxidation of iron, Materials Science and Engineering B 177 (2012) 327-336, Jan. 9, 2012.
Joseph Beardslee, Magnetic Alignment of High-Aspect Ratio Microwires into Vertical Arrays, May 27, 2014.
Hiralal et al, Growth and process conditions of aligned and patternable films of iron(III) oxide nanowires by thermal oxidation of iron, IOP Science Oct. 9, 2008.
Kim et al, Magnetic anisotropy of vertically aligned -Fe2O3 nanowire array, Applied physics Letters 89 (2006) Nov. 27, 2006.
Kim et al, Electronic Structure of Vertically Aligned Mn-Doped CoFe2O4 Nanowires and Their Application as Humidity Sensors and Photodetectors, J. Phys. Chem. C 2009, 113, 7085-7090, Apr. 7, 2009.
Solprene 9618, Technical Data Sheet, Dynasol, www.dynasolelastomers.com, May 2014.
Calprene 540, Technical Data Sheet, Dynasol, www.dynasolelastomers.com, May 2014.
Zheng Hui et al: "Synthesize of barium ferrite nanowire array by self-fabricated porous silicon template," Applied Surface Science, vol. 311, May 28, 2014 (May 28, 2014), pp. 672-675, XP028875837, ISSN: 0169-4332, DOI:10.1016/J.APSUSC.2014.05.134.
European Patent Office; Extended European Search Report; European Patent Application No. 17170629.4 dated Jan. 5, 2018.
Wen, et al; Controlled Growth of Large-Area, Uniform, Vertically Aligned Arrays of α-Fe2O3; J. Phys. Chem. B, 109, (2005), Dec. 4, 2004, pp. 215-220.

MICROWIRE ARRAY DEVICES AND METHODS FOR FABRICATING POLYMERIC SHEETS CONTAINING MICROWIRES

BACKGROUND

Carbonyl iron particles (CIP iron) mixed into a matrix of polymer or paint are known for use as electromagnetic interference (EMI) shielding. However, these structures do not have optimized magnetic properties because the magnetic properties cannot be tuned for application-specific needs.

Other known structures include perpendicularly aligned microwires and/or nanowires encapsulated in polymer matrices. Examples include carbon nanotubes in polymer gaskets and silicon microwires in polymer sheets (J. A. Beardslee, Magnetic alignment of high-aspect ratio microwires into perpendicular arrays, Ph. D. Thesis, California Institute of Technology, 2014). However, these structures are not magnetic.

Another example includes iron nanowires in polyaniline (H. Cao, Z. Xu, D. Sheng, J. Hong, H. Sang, Y. Du, J. Mater. Chem., 11, 958-960 (2001)). However, neither iron nor polyaniline are air stable materials and may fail after environmental exposure in most applications. This precludes their use for EMI and antenna shielding.

Known structures also include foil substrates with surfaces containing perpendicularly aligned arrays of iron oxide ($Fe_2O_3$) nanowires [C. H. Kim, H. J. Chun, D. S. Kim, S. Y. Kim, J. Park, J. Y. Moon, G. Lee, J. Yoon, Y. N Jo, M. H. Jung, S. I. Jung, C. J. Lee, Appl. Phys. Lett. 89, 223103 (2006); P. Hiralal, H. E. Unalan, K. G. UWijayantha, A. Kursumovic, D. Jefferson, J. L. MacManus-Driscoll, G. A. J. Amaratunga, Nanotechnology 19, 455608 (2008)] and iron oxide nanowires converted into magnetic cobalt ferrite ($CoFe_2O4$) [C. H. Kim, Y. Myung, Y. J. Cho, H. S. Kim, S.-H. Park, J. Park, J.-Y. Kim, B. Kim, J. Phys. Chem. C 113, 7085 (2009)]. Although the wires in the latter paper form magnetic ferrite microwire arrays with template-free growth at densities of approximately 1 wire/$\mu m^2$, the wires are chemically bonded to a foil substrate from which the wires were initially grown. The nanowire arrays are anchored to the foil substrate surface and lack a flexible polymer matrix. Thus, the arrays cannot conform to a complex surface and lack abrasion resistance to removal from the foil substrate.

Furthermore, known structures containing microwires or nanowires encapsulated in a flexible polymer layer use aligned wires at low densities, approximately 1 wire/10 $\mu m^2$ (J. A. Beardslee, Magnetic alignment of high-aspect ratio microwires into perpendicular arrays, Ph. D. Thesis, California Institute of Technology, 2014). These structures are made by physically inserting fully formed wires into aligning templates etched into a substrate such as silicon. After assembly, the wires are encapsulated in a flexible polymer layer and lifted off of the aligning substrate. However, it is not known how to increase the areal density of the aligned wires.

Lastly, arrays at much higher wire densities, often greater than 1 wire/$\mu m^2$, have been formed by directly growing wire arrays within templates such as anodic porous alumina. (J. A. Beardslee, Magnetic alignment of high-aspect ratio microwires into perpendicular arrays, Ph. D. Thesis, California Institute of Technology, 2014). After growth, the alumina template is dissolved and the wires are encapsulated in a flexible polymer layer. This technique would not work for magnetic ferrites because the same solution that dissolves the anodic alumina would also dissolve the ferrites. Further, these wire arrays do not have the crystal quality characteristic of template free wire growth and it is not known how to achieve the crystal quality of template-free growth while still using a template.

As appreciated from the deficiencies of previous efforts described above, a method for forming magnetic microwires aligned in a non-conductive, flexible polymer matrix would be beneficial.

SUMMARY

A method for fabricating polymeric sheets containing microwires includes providing a plurality of microwires. Individual microwires of the plurality are attached at an end to a substrate, have an independent length, are approximately perpendicular to the substrate, and contain magnetic ferrite. The method includes encapsulating at least a portion of individual lengths of the microwires in a non-conductive polymeric sheet while the microwires are attached to the substrate. The microwires are then detached from the substrate without removing the microwires from the polymeric sheet. The detaching step forms a separated polymeric sheet containing the detached microwires. Individual detached microwires of the plurality of microwires are approximately perpendicular to the separated polymeric sheet.

A microwire array device includes a non-conductive polymeric sheet and a plurality of microwires. Individual microwires of the plurality of microwires have an independent length at least partially encapsulated by the polymeric sheet, are approximately perpendicular to the polymeric sheet, and contain magnetic ferrite.

The features, functions, and advantages that have been discussed can be achieved independently in various embodiments or may be combined in yet other embodiments further details of which can be seen with reference to the following description and drawings.

BRIEF DESCRIPTION OF THE DRAWINGS

Some embodiments are described below with reference to the following accompanying drawings.

FIG. 1A shows the oxide substrate under the array. The length written below the scale bar corresponds to the entire length of the tick marks.

FIG. 3A shows the oxide substrate under the array. The length written below the scale bar corresponds to the entire length of the tick marks.

DETAILED DESCRIPTION

The methods and devices described herein provide magnetic, rod-shaped, metal oxide particles aligned in a polymer matrix. The polymer matrix may be nonconductive. The assembled composite device may be flexible, allowing conformance to a variety of surface contours, such as for antenna shielding, including in the microwave range of electromagnetic radiation. The device may exhibit directional anisotropy in a magnetic field.

Known devices, such as discussed in the Background section, that contain round or flake-shaped particles are different because they do not have rod-shaped particles, which contribute to the directional anisotropy of the devices herein. Known devices also include round silica particles as toughening agents, but these are neither magnetic nor rod-shaped.

Known methods in the Background section include encapsulation of carbon nanotubes in polymer gaskets and silicon microwires in polymer sheets. Known devices in the Background section include foil substrates with surfaces containing perpendicularly aligned arrays of iron oxide ($Fe_2O_3$) nanowires. However, using the known encapsulation method on the nanowires of the foil substrates and attempting to lift off the encapsulated nanowires causes the polymer gasket to break apart and does not remove an aligned array of microwires. Known devices in the Background section also include iron nanowires in polyaniline. However, polyaniline is conductive and iron is not a metal oxide, frustrating use as EMI and antenna shielding.

In comparison, composite microwire array devices described herein may include flexible sheets containing aligned magnetic microwires that enable optimizing magnetic properties including high moment and low coercivity that cannot be achieved with randomly-oriented magnetic materials. Desirable magnetic properties are provided by magnetic ferrites with suitable composition, size, density, and crystal quality for superior EMI and antenna shielding materials. Such magnetic ferrite properties are attainable through self-nucleated, template-free microwire growth from a foil substrate followed by chemical transformation. Methods herein teach treatments to facilitate removing the microwires from the substrate in a polymeric layer by peeling the polymeric layer away from the growth substrate while maintaining the array structure.

One method for fabricating polymeric sheets containing microwires includes providing a plurality of microwires. Individual microwires of the plurality are attached at an end to a substrate, have an independent length, are approximately perpendicular to the substrate, and contain magnetic ferrite. The method includes encapsulating at least a portion of individual lengths of the microwires in a non-conductive polymeric sheet while the microwires are attached to the substrate. The microwires are then detached from the substrate without removing the microwires from the polymeric sheet. The detaching step forms a separated polymeric sheet containing the detached microwires. Individual detached microwires of the plurality being approximately perpendicular to the separated polymeric sheet.

By way of example, the individual detached microwires may be approximately perpendicular to a surface of the polymeric sheet at a point where a longitudinal axis along the length of the microwire intersects the surface. In the context of the present document, "approximately perpendicular" means within 20° of perpendicularity, such as within 10°, including within 5°.

The method may further include growing a plurality of starting microwires on the substrate. The method may still further include chemically transforming the starting microwires to become the microwires containing magnetic ferrite. As an alternative, a substrate may be obtained already having the plurality of starting microwires grown thereon. The separately obtained substrate may then be chemically transformed to contain magnetic ferrite in the present method. Alternatively, the separately obtained substrate may already have microwires containing magnetic ferrite formed thereon.

The starting microwires may contain metal oxide. Further, the starting microwires may consist of metal oxide. Chemically transforming the starting microwires may involve an exchange reaction with metal halide salt. The metal oxide may include iron oxide, cobalt oxide, zinc oxide, nickel oxide, or a combination thereof. The metal halide salt may include $CoF_2$, $CoCl_2$, $CoBr_2$, $CoI_2$, $NiF_2$, $NiCl_2$, $NiBr_2$, $NiI_2$, $ZnF_2$, $ZnCl_2$, $ZnBr_2$, $ZnI_2$, $FeF_2$, $FeCl_2$, $FeBr_2$, $FeI_2$ or a combination thereof. For example, the metal halide salt may include $CoCl_2$, $NiCl_2$, $NiBr_2$, $NiI_2$, $ZnF_2$, $ZnCl_2$, $ZnBr_2$, $ZnI_2$, or a combination thereof. The transformed microwires may contain magnetic ferrite. Further, the transformed microwires may consist of magnetic ferrite.

The examples herein of implementing the present method form iron oxide in the starting microwires. Conceivably, the starting microwires could lack iron oxide and contain only other metal oxides. In such case, a metal halide salt containing iron could be used to form the magnetic ferrite. In the context of the present document "ferrite" is defined to include a ceramic compound consisting of a mixed oxide of iron and one or more other metals. Thus, "ferrite" encompasses $MFe_2O_4$, where M is Ni, Co, Zn, or combinations thereof. "Ferrite" also encompasses other compounds.

A few ferrite-producing reactions are as follows, with numerous similar reactions possible:

(1)

(2)

(3)

(4)

Reactions 1 and 2 account for the different oxidation states of Fe(II) and Fe(III) found in $Fe_3O_4$ and Co(II) and Co(III) found in $Co_3O_4$, while Reactions 3 and 4 account for the Ni(II) only oxidation state found in NiO and Zn(II) only found in ZnO. According to some traditional definitions not adopted in the present document, "ferrite" is limited to a ceramic compound composed of iron oxide ($Fe_2O_3$) combined chemically with one or more additional metallic elements as in $MFe_2O_4$, where M is another metal. Since ferrite compounds, as defined herein, might exhibit similar properties for the purposes of the methods and devices herein, the definition herein is convenient.

The method may further include treating the microwires or the substrate or both. The treatment weakens microwire attachment to the substrate or reduces polymeric sheet adhesion to the substrate or both. Regarding weakening the microwire attachment, the substrate may include a non-ferrite base over which the microwires are attached. The treating may include preferentially etching the non-ferrite base, compared to the magnetic ferrite in the microwires, with an acid or base solution, thereby weakening microwire attachment to the substrate.

The "preferential" etching refers to etching the non-ferrite base at a greater rate than the magnetic ferrite in the microwires even though both are exposed to the same etchant. The etch rates may be sufficiently different that the magnetic ferrite is only etched a de minimis amount while the microwire attachment to the non-ferrite base is weakened enough that detaching the microwires is noticeably easier than without the etching. As one example, $Fe_3O_4$ of the substrate is more soluble in acid compared to $NiFe_2O_4$ in the microwires. The acid solution may include HCl or HF and the base solution may include NaOH. The acid solution may exhibit a pH of less than 4, such as a pH of less than 1, and the base solution may exhibit a pH of greater than 10, such as a pH of greater than 12.

Regarding reducing polymeric sheet adhesion, the substrate might exhibit a tendency to adhere to the polymeric sheet contacting the substrate between the microwires. The treating may then include applying an inert oil to the substrate before the encapsulation in the polymeric sheet, thereby reducing polymeric sheet adhesion to the substrate. The inert oil may contain silicone oil.

Instead, or in addition, the treating may include applying a sacrificial layer to the substrate before the encapsulation in the polymeric sheet and preferentially removing the sacrificial layer, compared to the polymeric sheet, before detaching the microwires from the substrate, thereby reducing polymeric sheet adhesion to the substrate. The sacrificial layer may contain polyvinyl alcohol, dodecanoic acid, or a combination thereof. Preferentially removing the sacrificial layer may include preferentially dissolving the sacrificial layer with a solvent. Thus, the "preferential" dissolving refers to dissolving the sacrificial layer at a greater rate than the polymeric sheet. Examples of solvents include water, methanol, ethanol, tetrahydrofuran, isopropyl alcohol, and acetone. The polymeric sheet might dissolve only in toluene, enabling the preferential dissolving.

Encapsulation of the microwires may include applying a block copolymer to the microwires. The applied block copolymer may be dissolved in a solvent or melted. The block copolymer may contain styrene-butadiene-styrene (SBS) block copolymer. The encapsulation may include applying a first SBS block copolymer mixed with a different, second SBS block copolymer, the first copolymer having a styrene content greater than 30%, the second copolymer having a styrene content greater than the first copolymer, and an applied amount of the higher-styrene-content second copolymer being less than the first copolymer. For example, the first copolymer may have a styrene content of about 30 to about 45%, such as from greater than 31 to about 45%. The second copolymer may have a styrene content of about 90 to about 100%, such as about 90 to about 98%. The ratio of higher-styrene-content second copolymer to lower-styrene-content first copolymer may be from about 2:98 to about 10:90. The polymer sheet may be of sufficient thickness to encapsulate all of the individual lengths of the plurality of microwires. Further, the thickness may be 10 to 200 microns.

The features and benefits of individual methods herein may also be used in combination with other methods and devices discussed herein even though not specifically indicated otherwise. Similarly, the features and benefits of individual devices herein may also be used in combination with other devices and methods discussed herein even though not specifically indicated otherwise. Accordingly, the methods described herein may be used to produce a microwire array device. One example of such a device includes a non-conductive polymeric sheet and a plurality of microwires. Individual microwires of the plurality have an independent length at least partially encapsulated by the polymeric sheet, are approximately perpendicular to the polymeric sheet, and contain magnetic ferrite.

By way of example, the device and its components may possess one or more of the properties and characteristics as described with respect to the methods herein. Likewise, components and materials used in the method may possess one or more of the properties and characteristics as described with respect to the devices herein.

As one example, microwire lengths may range from about 1 μm to about 100 μm, such as from about 5 μm to about 20 μm. The microwires may have a width of about 0.1 μm to about 1 μm, such as about 0.5 μm. The microwires may form an array of microwires having an areal density of about 0.1 wire/μm$^2$ to about 10 wire/μm$^2$, such as about 1 wire/μm$^2$ to about 10 wire/μm$^2$. The microwires may be within 20° of perpendicularity, such as with 10°, including within 5°.

Composition of the substrate, chemical transformation reactants, and reaction conditions may selected such that the magnetic ferrite is a single bicrystal with a [110] crystallographic orientation along the microwire length. Also, the magnetic ferrite may comprise $MFe_2O_4$, where M is Ni, Co, Zn, or combinations thereof.

The structure of the polymer sheet encapsulated arrays includes wires with compositions that may begin as iron oxide ($Fe_2O_3$), then are reduced to magnetic iron oxide ($Fe_3O_4$), and are transformed to a magnetic ferrite, such as $MFe_2O_4$. The wires may be crystalline with crystal habits characteristic of nucleation and growth from a substrate. The polymeric layer used to encapsulate the wires may be a composition selected with properties including viscosity, adhesion, flexibility, and solubility sufficient to accomplish the methods herein and to produce the devices herein.

For example, too high of viscosity reduces the ability of the polymer to flow between microwires of an array with the areal densities described herein and frustrates complete encapsulation. Also, too strong of adhesion may permit adherence to the microwires, but reduce the ability to separate the polymeric sheet from the substrate in a continuous piece of usable size for intended applications, such as antenna shielding. Further, too low of flexibility may reduce the ability to peel the polymeric sheet off the rigid substrate and/or reduce conformance to surface contours of an intended application. Still further, too high of solubility in a solvent used to remove a sacrificial layer may frustrate the method herein where the sacrificial layer is dissolved preferentially to the polymeric sheet.

According to Examples 1-4 described below, one method to remove the microwires from the substrate involves treating the microwires or the substrate or both before depositing and peeling the polymeric layer. Two treatment variations are described: 1) lightly etching the base substrate of the wires with an acid solution and then applying a thin layer of inert oil to reduce adhesion of the polymer to the substrate and 2) applying a water soluble layer at the base of the wires that is dissolved in water while the wires are peeled.

After the treatment, a solution of flexible polymer in an organic solvent is deposited onto the wire array. The polymer is left to cure by evaporation of the solvent. Then, the polymer layer containing the microwire array is peeled off of the substrate. In the second variation, the peeling occurs in the presence of water to dissolve the sacrificial layer. The flexibility of the polymer allows for peeling while maintaining the perpendicular alignment and areal density of the microwire array.

Accordingly to Example 5 described below, another method to remove the microwires from the substrate does not involve treating the microwires or the substrate before depositing and peeling the polymeric layer. Even so, Comparative Example 3 shows that a suitable polymer should be selected.

The wires initiated growth (that is, nucleation) upon elevated temperature (~800° C.) oxidation of iron foil. As published previously, the wires grew perpendicular to the foil surface, unconstrained by any surrounding template, as single bicrystals with a [110] crystallographic growth orientation along the wire axis and with growth from the tip of the wires (H. Srivastava, P. Tiwari, A. K. Srivastava, R. V. Nandedkar, J. Appl. Phys., 102, 054303 (2007), L. Yuan, Y. Wang, R. Cai, Q. Jiang, J, Wang, B. Li, A. Sharma, G. Zhou, Mater. Sci. Eng. B, 177 327-336 (2012), X. Wen, S. Wang, Y. Ding, Z.-L. Wang, S. Yang, J. Phys. Chem. B, 109, 215-220, (2005), A. G. Nasibulin, S. Rackauskas, H. Jaing, Y. Tian, P. R. Mulimela, S. D. Shandakov, L. I. Nasibulina, J. Sainio, E. I. Kauppinen, Nano Res., 2, 373-379 (2009)).

Thin flexible polymeric sheets containing arrays of perpendicularly aligned microwires composed of magnetic ferrites were fabricated by a multiple step process including 1) thermally growing arrays of iron oxide ($Fe_2O_3$) microwires aligned perpendicular to the surface of an iron foil, 2) transforming the $Fe_2O_3$ wires into magnetic ferrites through a gas phase reaction with metal halide salts and, 3) encapsulating the ferrite microwires in a polymer layer and removing the microwire array from the substrate as a freestanding flexible film.

Step 1: Iron oxide microwire formation: This step is well described in the literature. Arrays of $Fe_2O_3$ microwires were synthesized by oxidation of iron foils. In a known synthesis, high purity (99.99%) iron foil substrates (eg, ~2 cm×2 cm and 0.25 mm thick) may be heated in flowing argon (20 sccm (standard cubic centimeters per minute) to 200 sccm) to temperatures of 750° C. to 800° C. Upon reaching the desired temperature, $O_2$ (10 sccm to 100 sccm) is added to the flowing argon. The growth time is ~1 hr to ~10 hr. The wires grow aligned perpendicular to the substrate. The wires are ~5 μm to >20 μm long and ~1 μm thick. The areal density of wires is approximately 1 wire/μmt. Underneath the wires, a bulk layer of oxide includes thinner layers of $Fe_2O_3$ and $Fe_3O_4$ on top of a thicker layer of FeO. The total thickness of the oxide layers varies from ~50 μm to 200 μm depending on the growth conditions and time. Often the bulk oxide layer will spall off of the underlying unoxidized metal foil. Wires grow on both sides of the foil. An example is given below.

Step 2: Transformation into ferrite microwire arrays: This step has been described in the literature. Arrays of iron oxide microwires can be exposed to a metal halide vapor in flowing argon at 750-850° C. and the metal from the metal halide exchanges with iron atoms at the same oxidation state, ⅓ of iron atoms, to form a magnetic ferrite. The transformation to magnetic ferrite occurs in two steps. First, heating the array of iron oxide microwires in Ar produces an array of $Fe_3O_4$ microwires resulting from thermal reduction of the of $Fe_2O_3$. Then an exchange reaction occurs between a metal halide (e.g. $MCl_2$) and the Fe(II) in $Fe_3O_4$:

$$MCl_2(gas) + Fe_3O_4(solid\ wires) \rightarrow MFe_2O_4(solid\ wires) + FeCl_2(gas) \qquad (5)$$

This exchange reaction replaces ⅓ of the iron in $Fe_3O_4$ with another metal ion (only Fe(II) in $Fe_3O_4$ is replaced) and maintains the microwire shape because the total atoms in the solid wire are kept constant and the crystal structure is unchanged before and after the transformation. An example is given below.

Step 3: Liftoff of freestanding films of microwires: The removal of the wires from the substrate in a polymer film is not described in the literature. This step was challenging for several reasons. One, the high density of the wires prompted a need for a low viscosity polymer to fully permeate the forest of wires. Secondly, because the wires initially grew from a continuous layer of oxide and the bases of the wires provided a rough surface with high surface area, the adhesion to the substrate layer was very strong. Often, any polymer that infiltrated the wires could not be peeled off without cohesive failure, i.e. ripping.

The microwires were encapsulated in a polystyrene-polybutadiene copolymer (SBS polymer) with a low viscosity, enabling conformal coverage of the microwires, chemical resistance to acid, and high mechanical strength to withstand the forces of peeling off the polymer from the substrate. In a SBS polymer, the styrene contributes to the polymer's strength while the butadiene gives it its elastic properties. A higher styrene percentage made the polymer stick less to the substrate, but too much styrene led to cohesive failures.

Three methods (described below) were used to peel off the polymer encasing the microwires. For a SBS polymer with a lower styrene concentration (31% styrene, SOLPRENE 9168 available from Dynasol in Houston, Tex.), pre-treatments before encasing microwires in polymer in method (A) and (B) below were used to reduce adhesion to the substrate. Method (C) relied on a specific blend of SBS polymers with higher styrene concentration to reduce that adhesion and, thus, no pre-treatment was used.

A.) Acid Pre-Etching and Lubricating Layer:

The base of the wires was first weakened to facilitate the peel-off of the polymer by pre-etching the ferrite wires in aqueous acid. This acid treatment slightly undercut the wires. A thin lubricating layer of inert oil (Silicone Oil 200 available from Dow Corning Corp.) was applied onto the substrate. The oil reduced adhesion of the polymer to the substrate. The polymer (SOLPRENE 9618), dissolved in organic solvent, was then drop-cast onto the substrate and dried. The polymer was then peeled off of the substrate by first securing the substrate onto a glass slide with epoxy, then sliding a razor under the polymer along one edge (to initiate peeling) and slowly peeling back the elastomer with the encased microwires.

B.) Sacrificial Polyvinyl Alcohol Layer:

Instead of pre-etching with acid and adding a lubricating layer, a drop of an aqueous solution of polyvinyl alcohol (PVA) was dried on the microwire array, forming a thin PVA layer at the base of the wires as a sacrificial layer, before drop casting the encapsulation polymer. The thin layer of PVA was dissolved away with water thereby separating the elastomer encasing the majority of the microwires from the substrate, facilitating its peel-off.

C.) Blended Polymer:

A specific blend of two types of polystyrene-polybutadiene (SBS) polymers resulted in a good balance between strength and elasticity, allowing the microwires embedded in the polymer to be peeled off without the additional treatments mentioned in methods A and B. A high styrene SBS polymer (96% styrene) and a mid-level styrene SBS polymer (CALPRENE 540, 40% styrene, available from Dynasol) were each dissolved in toluene. The two copolymers were blended together with an 8 to 92 ratio of high styrene to mid-styrene.

Methods A to C of fabricating thin flexible polymeric sheets containing arrays of perpendicularly aligned microwires composed of magnetic ferrites are further described in the following examples.

Example 1

Synthesis of Aligned $Fe_2O_3$ Microwire Arrays on an Iron Foil Substrate.

Figure 1A:
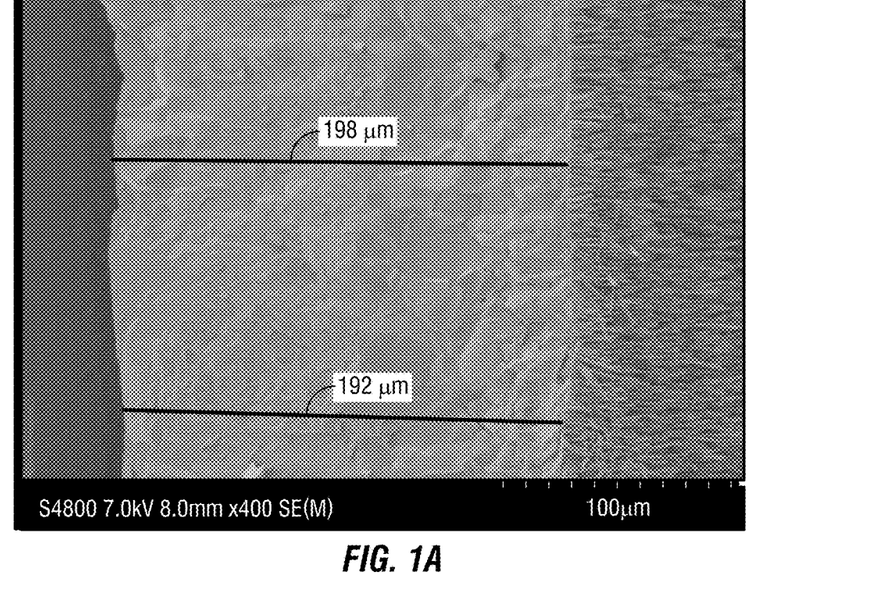
FIGS. 1A and 1B are a cross section scanning electron microscope (SEM) images of $Fe_2O_3$ microwires and oxide substrate. The starting foil was 99.99%, 0.25 mm thick Fe; the growth temperature was 800° C.; the gas composition was 100 sccm (standard cubic centimeters per minute) Ar+50 sccm $O_2$; and the growth time was 10 hr.
Figure 1B:
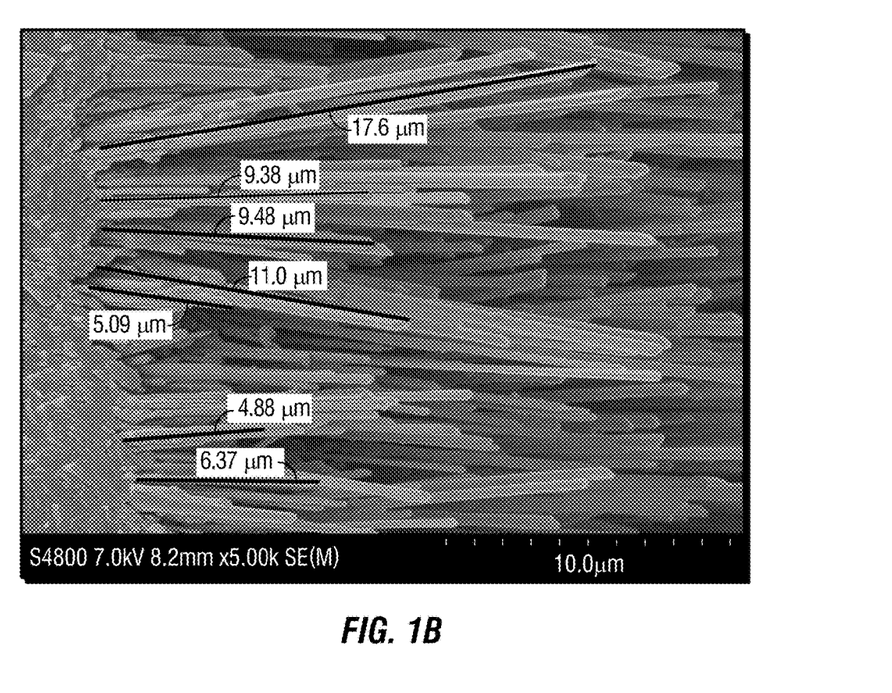

An approximately 2 cm×2 cm piece was cut from a 99.99% purity iron foil 0.25 mm thick obtained from ESPI Metals in Ashland, Oreg. The foil was wiped with acetone and supported across the edges of an alumina ceramic boat. The boat was heated in 100 sccm of flowing Ar to 750° C. Upon reaching 750° C., 50 sccm of $O_2$ was added to the flowing Ar. The growth time at 750° C. was 8 hr. A second sample was processed similarly except that the growth temperature was 800° C. and the time was 10 hr. A scanning electron microscope (SEM) image of a cross section of the wires and the bulk oxide layer for the growth at 800° C. is shown in FIGS. 1A and 1B.

Example 2

Synthesis of Aligned Ferrite Microwire Arrays on an Iron Foil Substrate.

Figure 2:
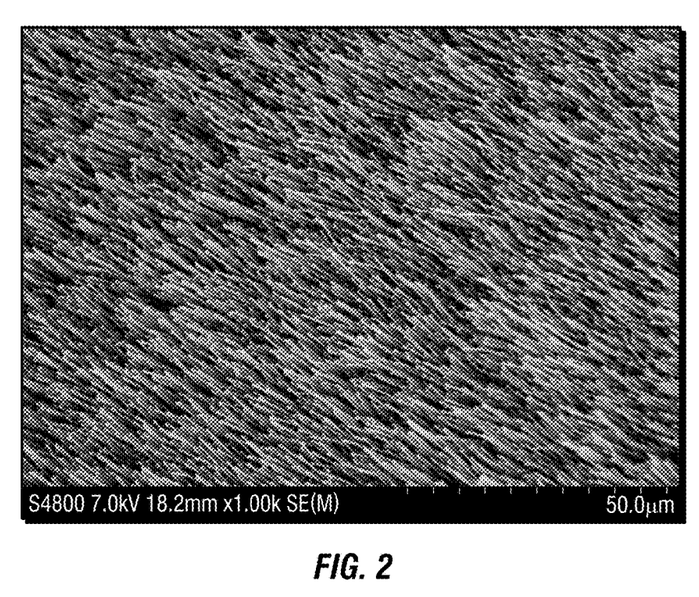
FIG. 2 is a SEM image of a $NiFe_2O_4$ microwire array made through a gas phase exchange reaction and has the same shape as the starting $Fe_2O_3$ microwire array. The length written below the scale bar corresponds to the entire length of the tick marks.

Beginning from a sample such as that described in Example 1, an aligned ferrite microwire array was synthesized by placing the Example 1 array in an atmosphere controlled tube furnace with 70 mg of a metal salt such as $NiCl_2$. Argon was flowed through the furnace at 10-100 $cm^3$/min and the temperature was ramped from room temperature to 800° C. in 45 minutes, held at 800° C. for 30 min, and cooled. The argon flow continued until the sample was removed. X-ray diffraction (XRD) showed the material transformed into $NiFe_2O_4$ and a SEM image of the microwire array is shown in FIG. 2.

Figure 3A:
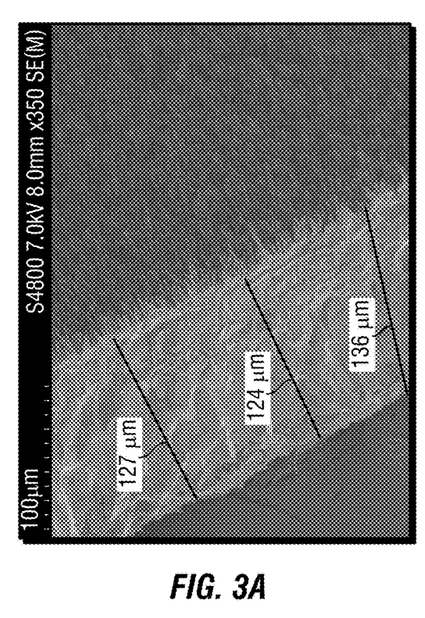
FIGS. 3A and 3B are SEM images of a $Ni_{0.4}Co_{0.6}Fe_2O_4$ microwire array that has a very similar shape as the starting $Fe_2O_3$ microwire array.
Figure 3B:
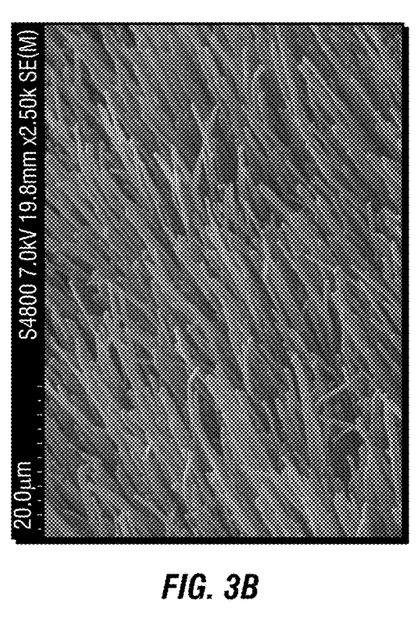

A mixed-metal, magnetic ferrite was synthesized in a similar process. Beginning from a sample such as that described in Example 1, the Example 1 array was placed in an atmosphere controlled tube furnace with 70 mg of two metal salts ($NiCl_2$ and $CoCl_2$) mixed in a 1:1 mass:mass ratio. Argon was flowed through the furnace at 10-100 $cm^3$/min and the temperature was ramped from room temperature to 800° C. in 45 minutes, held at 800° C. for 30 min, and cooled. The argon flow continued until the sample was removed. Energy dispersive X-ray spectroscopy (EDS) in an analyzer available from EDAX in Mahwah, N.J. showed the material transformed into $Ni_{0.4}Co_{0.6}Fe_2O_4$ and SEM images of the microwire array are shown in FIGS. 3A and 3B.

Example 3

Liftoff of Freestanding Films of Microwires.

Using an array of ferrite microwires on a substrate such as that described in Example 2, a freestanding film of aligned ferrite microwires was fabricated by first etching the wire array in 3M HCl solution for 10 min to weaken the base of the wires. After washing with water and drying, a thin lubricating and adhesion reducing layer of silicone oil was applied by depositing one drop of toluene containing 1 part silicone oil to 25 parts toluene onto the substrate and allowing the toluene to evaporate. Then a solution of polystyrene-polybutadiene copolymer (SOLPRENE 9618) dissolved in toluene was drop cast onto the substrate and dried. The drop-cast and dry steps were repeated for several layers until the polymer layer built up 100 μm, thick enough to be handled with tweezers. The SOLPRENE has a low viscosity enabling conformal coverage of the microwires, chemical resistance to acid, and high mechanical strength to withstand the forces of peeling off the polymer from the substrate.

Figure 4:
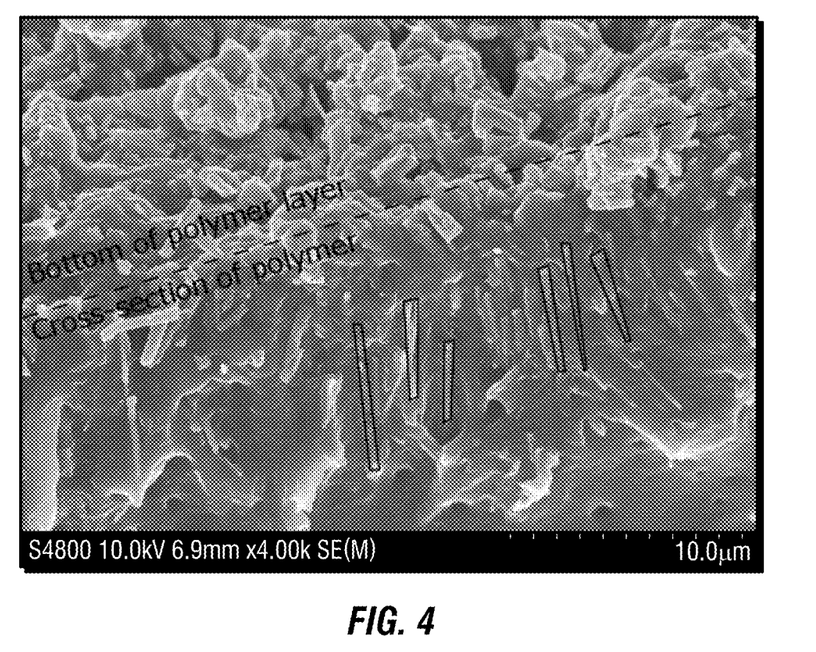
FIG. 4 is a cross-sectional SEM of sample $NiFe_2O_4$ wires embedded in styrene-butadiene-styrene (SBS) polymer (SOLPRENE 9168), lifted off with the acid pre-etched and lubricating layer method. The ferrite microwires (some outlined in black) are observed to be encased in polymer. The SEM image was taken by fracturing the polymer in FIG. 5 shows ferromagnetic hysteresis loops of $Ni_{0.4}Co_{0.6}Fe_2O_4$ microwires in free-standing polymer. Magnetic data was taken with applied fields parallel (dashed trace) and perpendicular (solid trace) to the wires.

The substrate was then secured onto a glass slide with epoxy. The freestanding film of SOLPRENE copolymer was peeled from the substrate by sliding a razor blade under the polymer along one edge to initiate peeling and then slowly peeling back the SOLPRENE containing the encased perpendicularly aligned ferrite microwires. Approximately 2 cm×2 cm sheets were obtained. An SEM micrograph of the freestanding layer is shown in FIG. 4.

Figure 5:
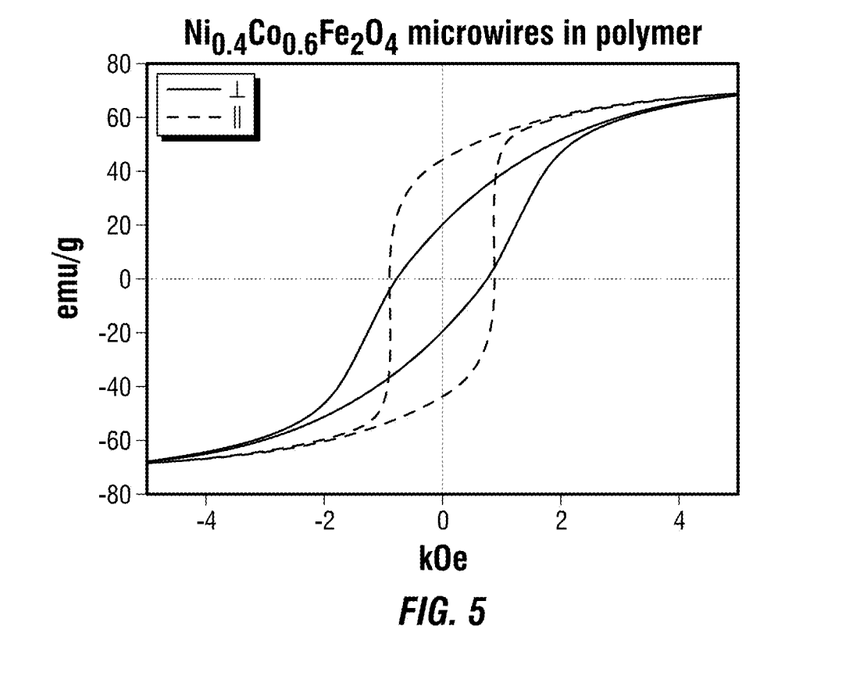

Microwire alignment in the polymer film is characterized by a larger hysteresis and remanence when the applied field is parallel to the wire axis. FIG. 5 shows the directional anisotropy in hysteresis loops for a free-standing nickel cobalt ferrite composite film. Microwire alignment in the polymer film is shown by a larger hysteresis and remanence when the applied field is parallel to the wire axis.

Example 4

Liftoff of Freestanding Films of Microwires with a Sacrificial Polymer Layer.

Figure 6:
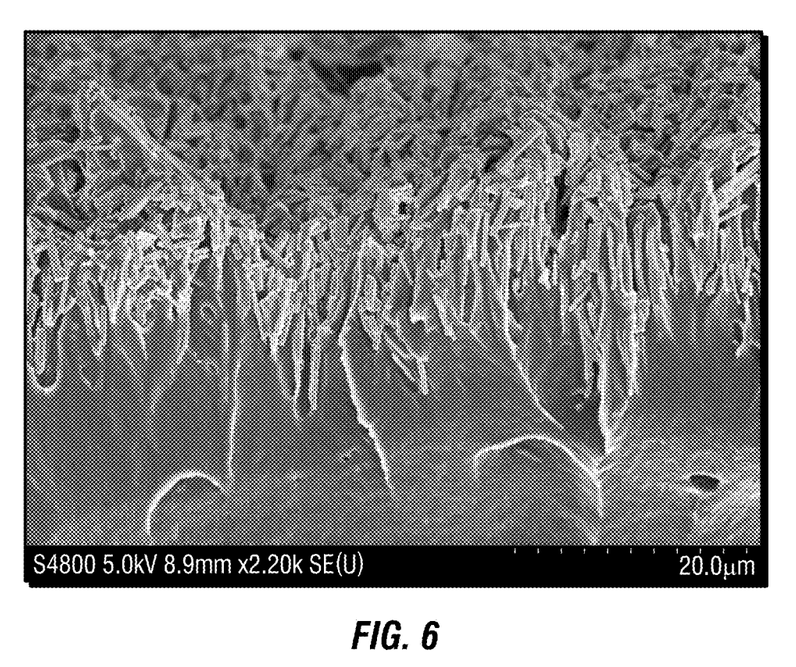
FIG. 6 is a cross-sectional SEM of $Ni_{0.4}Co_{0.6}Fe_2O_4$ wires embedded in SOLPRENE, peeled-off with a sacrificial layer of polyvinyl alcohol (PVA). The SEM was taken by fracturing the polymer in liquid nitrogen and then imaging the cross-section at a high tilt angle. The microwires were aligned perpendicularly in the polymer.

Using an array of ferrite microwires on a substrate such as that described in Example 2, a freestanding film of aligned ferrite microwires was fabricated by first wetting ~10-20 μL of 0.5% wt polyvinyl alcohol (PVA) throughout the sample. Cross-sectional SEMs taken suggest the PVA layer was about 2-5 μm thick, coating at the bottom of the microwires. After the thin PVA layer dried, a solution of polystyrene-polybutadiene copolymer (SOLPRENE 9618) dissolved in toluene was drop cast onto the substrate and dried. The drop-cast and dry steps were repeated for several layers until the polymer layer built up ~100 μm, thick enough to be handled with tweezers. The substrate was then secured onto a glass slide with epoxy. The freestanding film of SOLPRENE copolymer was peeled from the substrate by sliding a razor blade under the polymer along one edge to initiate peeling. The edge of the polymer was then sporadically subjected to a stream of deionized water to dissolve the underlying PVA layer before peeling back the SOLPRENE containing the encased perpendicularly aligned ferrite microwires. An SEM micrograph of the freestanding layer is shown in FIG. 6.

Example 5

Liftoff of Freestanding Films of Microwires with a Blended SBS Polymers.

Figure 7:
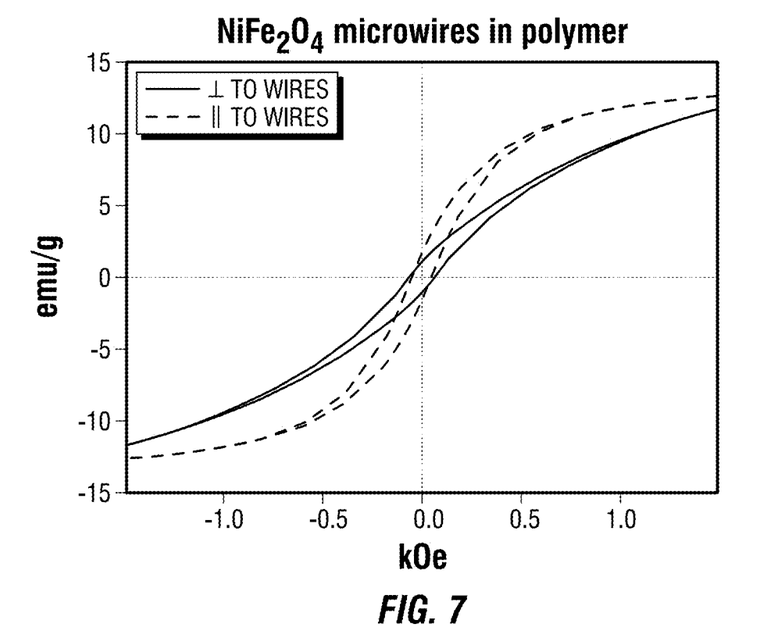
FIG. 7 shows ferromagnetic hysteresis loops of $NiFe_2O_4$ microwires in free-standing polymer. Magnetic data was taken with applied fields parallel (dashed trace) and perpendicular (solid trace) to the wires.

Two SBS polymers were separately dissolved in toluene: a higher styrene SBS (96% styrene) and a mid styrene SBS (CALPRENE 540, 40% styrene). A blend of SBS polymers was achieved by mixing the two SBS polymers in a 8:92 high styrene:mid styrene mass ratio. Using an array of ferrite microwires on a substrate such as that described in Example 2, a freestanding film of aligned ferrite microwires was fabricated by drop casting the blended polymer solution onto the substrate and leaving it to dry. The drop-cast and dry steps were repeated for several layers until the polymer layer built up ~100 µm, thick enough to be handled with tweezers. The substrate was then secured onto a glass slide with epoxy. The freestanding film of SBS polymer was peeled from the substrate by sliding a razor blade under the polymer along one edge to initiate peeling. The rest of the film was peeled with tweezers or fingers. Magnetic response to a field parallel and perpendicular to the wires is shown in FIG. 7.

Comparative Example 1

Encasing Microwires in PARYLENE C.

Using an iron oxide microwire sample from Example 1, ~200 µm of PARYLENE C was vapor-deposited with a SCS Parylene Coating System available from Specialty Coating Systems in Indianapolis, Ind. PARYLENE C is the trade name for a poly(para-xylylene) polymer with a substitution of chlorine for one of the aromatic hydrogens. The adhesion of the PARYLENE C was too strong to the substrate, and no amount of force successfully lifted off any of the microwires.

Comparative Example 2

Encasing Microwires in PDMS.

Different polydimethylsioxane (PDMS) polymers of varying viscosities were drop-casted onto iron oxide microwire samples from Example 1. The polymer was left to dry overnight and peeled by sliding a razor under the polymer film and peeled back. A high viscosity blend of PDMS peeled off easily but did not pull off any microwires. A lower viscosity PDMS (GELEST, DMS-V21 and HMS-501 with 10% wt silica beads) was drop-cast, and cross-sectional SEM suggested good permeability of the polymer around the wires. However, the PDMS layer ripped because it was not strong enough to withstand forces from peeling off the polymer-microwire composite.

Comparative Example 3

Encasing microwire in SOLPRENE adhesive without a silicone oil adhesion reducing layer.

Samples of iron oxide or iron ferrite microwires, such as those from Example 1 and 2 were encased on SOLPRENE adhesive without any prior adhesion reduction treatment. After mounting a sample onto a glass slide with epoxy, a sheet of SOLPRENE 9618 adhesive was placed over the microwire array. Next a drop or two of toluene was placed onto the adhesive sheet. The toluene dissolved the polymer, thereby encasing the wires. The toluene was then allowed to evaporate reforming the polymer with the wires now encased. Using a razor blade and forceps, as described in the examples above, only small approximately 1 mm×1 mm pieces, of polymer could be peeled from the substrate. Attempts to peel larger pieces continually resulted in the polymer ripping, due to the strong adhesion with the substrate. This shows how silicone oil, or another material that reduces adhesion to the substrate, may be used to remove large, freestanding sheets of microwires.

In compliance with the statute, the embodiments have been described in language more or less specific as to structural and methodical features. It is to be understood, however, that the embodiments are not limited to the specific features shown and described. The embodiments are, therefore, claimed in any of their forms or modifications within the proper scope of the appended claims appropriately interpreted in accordance with the doctrine of equivalents.

What is claimed is:

1. A method for fabricating polymeric sheets containing microwires comprising:
   providing a plurality of microwires, individual microwires of the plurality being attached at an end to a substrate, having been grown on the substrate, having an independent length, being approximately perpendicular to the substrate, and containing magnetic ferrite;
   encapsulating at least a portion of individual lengths of the microwires in a non-conductive polymeric sheet while the microwires are attached to the substrate;
   detaching the microwires from the substrate without removing the microwires from the polymeric sheet, the detaching forming a separated polymeric sheet containing the detached microwires and individual detached microwires of the plurality of microwires being approximately perpendicular to the separated polymeric sheet.

2. The method of claim 1 further comprising growing a plurality of starting microwires on the substrate and chemically transforming the starting microwires to become the microwires containing magnetic ferrite.

3. The method of claim 2 wherein the starting microwires comprise metal oxide and chemically transforming the starting microwires comprises an exchange reaction with metal halide salt.

4. The method of claim 3 wherein the metal oxide comprises iron oxide, cobalt oxide, zinc oxide, nickel oxide, or a combination thereof and the metal halide salt comprises $CoCl_2$, $NiCl_2$, $NiBr_2$, $NiI_2$, $ZnF_2$, $ZnCl_2$, $ZnBr_2$, $ZnI_2$, or a combination thereof.

5. The method of claim 1 further comprising, before the encapsulation, treating the microwires or the substrate or both and thereby weakening microwire attachment to the substrate or reducing polymeric sheet adhesion to the substrate or both.

6. The method of claim 5 wherein the substrate comprises a non-ferrite base over which the microwires are attached and the treating comprises preferentially etching the non-ferrite base, compared to the magnetic ferrite in the microwires, with an acid or base solution, thereby weakening microwire attachment to the substrate.

7. The method of claim 6 wherein the acid solution comprises HCl or HF and the base solution comprises NaOH.

8. The method of claim 5 wherein the treating comprises applying an inert oil to the substrate before the encapsulation in the polymeric sheet, thereby reducing polymeric sheet adhesion to the substrate.

9. The method of claim 8 wherein the inert oil comprises silicone oil.

10. The method of claim 5 wherein the treating comprises applying a sacrificial layer to the substrate before the encapsulation in the polymeric sheet and preferentially removing the sacrificial layer, compared to the polymeric sheet, before detaching the microwires from the substrate, thereby reducing polymeric sheet adhesion to the substrate.

11. The method of claim 10 wherein the sacrificial layer comprises polyvinyl alcohol, dodecanoic acid, or a combination thereof and preferentially removing the sacrificial layer comprises dissolving the sacrificial layer with a solvent.

12. The method of claim 1 wherein the encapsulation comprises applying a block copolymer to the microwires, the applied block copolymer being dissolved in a solvent or melted.

13. The method of claim 12 wherein the block copolymer comprises styrene-butadiene-styrene (SBS) block copolymer.

14. The method of claim 13 wherein the encapsulation comprises applying a first SBS block copolymer mixed with a different, second SBS block copolymer, the first copolymer having a styrene content greater than 30%, the second copolymer having a styrene content greater than the first copolymer, and an applied amount of the higher-styrene-content second copolymer being less than the first copolymer.

15. The method of claim 1 wherein the microwires comprise $MFe_2O_4$, where M is Ni, Co, Zn, or combinations thereof.

16. The method of claim 1, wherein the microwire lengths are about 1 μm to about 100 μm and the microwires have a width of about 0.1 μm to about 1 μm.

17. The method of claim 1, wherein the microwire lengths are about 5 μm to about 20 μm and the microwires have a width of about 0.5 μm.

18. The method of claim 1, further comprising:
forming an array of the microwires, the array having an areal density of about 0.1 wire/$μm^2$ to about 10 wire/$μm^2$.

19. The method of claim 1, wherein the microwires are within 20° of perpendicularity to the substrate.

20. The method of claim 1, wherein the magnetic ferrite is a single bicrystal with a [110] crystallographic orientation along the microwire length.

* * * * *